United States Patent
Ouchi

(10) Patent No.: US 8,520,454 B2
(45) Date of Patent: Aug. 27, 2013

(54) SRAM DEVICE CAPABLE OF INDEPENDENTLY CONTROLLING A DOUBLE-GATE SELECTION TRANSISTOR FOR MAINTAINING AN OPTIMAL READ MARGIN AND READ SPEED

(75) Inventor: Shinichi Ouchi, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 207 days.

(21) Appl. No.: 13/051,022

(22) Filed: Mar. 18, 2011

(65) Prior Publication Data

US 2011/0242881 A1  Oct. 6, 2011

(30) Foreign Application Priority Data

Mar. 30, 2010 (JP) .................................. 2010-079158

(51) Int. Cl.
*G11C 11/419* (2006.01)
(52) U.S. Cl.
USPC ................. 365/189.15; 365/189.08; 365/190; 365/205; 365/208; 365/207; 365/156; 365/154

(58) Field of Classification Search
USPC .......... 365/156, 154, 189.15, 189.11, 189.08, 365/190, 205, 208, 207
See application file for complete search history.

(56) References Cited

U.S. PATENT DOCUMENTS

| | | | |
|---|---|---|---|
| 6,731,533 B2 * | 5/2004 | Deng et al. ..................... | 365/154 |
| 7,511,989 B2 | 3/2009 | Thomas et al. | |
| 7,952,913 B2 * | 5/2011 | Hanafi .......................... | 365/156 |
| 8,139,400 B2 * | 3/2012 | Bansal et al. .................. | 365/154 |
| 8,320,198 B2 * | 11/2012 | Thomas et al. .......... | 365/189.11 |
| 2010/0110774 A1 | 5/2010 | Ouchi et al. | |

FOREIGN PATENT DOCUMENTS

JP  2007-020110  1/2007

* cited by examiner

*Primary Examiner* — Andrew Q Tran
(74) *Attorney, Agent, or Firm* — Bacon & Thomas, PLLC

(57) ABSTRACT

A SRAM device which can set a threshold voltage of a selection transistor appropriate for all the cells on an SRAM array is disclosed. The SRAM device uses a field effect transistor as the selection transistor. The field effect transistor includes a gate to drive the transistor and a terminal to control a threshold voltage, which are electrically separated from each other. The SRAM device also includes a circuit which, in a reading operation, gradually increases a voltage supplied to the terminal at the start of the reading to control the threshold of the selection transistor.

10 Claims, 9 Drawing Sheets

SRAM DEVICE CAPABLE OF INDEPENDENTLY CONTROLLING A DOUBLE-GATE SELECTION TRANSISTOR FOR MAINTAINING AN OPTIMAL READ MARGIN AND READ SPEED

TECHNICAL FIELD

The present invention relates to a static random access memory (SRAM) device.

BACKGROUND ART

Today, in conventional SRAM devices, 6-transistor CMOS SRAM cells are configured using planar metal-oxide silicon (MOS) field effect transistors.

However, miniaturization of the device dimensions, to improve integration density and operation speed, increases variation in the characteristics of the devices produced. The variation obviously affects the operational stability of the SRAM. That is, the performances of the respective devices deviate randomly from the design target, so that mismatch occurs and bistability, which is indispensable for memory retention, is reduced. The variation in the device characteristics may eventually lead to malfunction, so that the production yield will be lowered and reliability of the information systems will be lowered.

As an index for evaluating bistability, noise margin can be employed. The noise margin is defined as the maximum voltage of the noise amplitude which is allowed to be superposed on memory nodes. A sufficient noise margin for a read operation, i.e., a read margin, is the most difficult to ensure. The above-mentioned mismatch between the devices reduces the read margin. Therefore, the SRAM device is designed so that the noise margin is as large as possible. This ensures a sufficient noise margin even with a large variation in the performance of the devices as produced.

This read margin is essentially in a trade-off relationship with a read current which determines read speed. That is, a cell with a larger read margin has a slower read speed, while a cell with a faster read speed has a smaller read margin. The selection transistor or pass gate connecting to a node holding a potential corresponding to the logic '0' is the cause of the trade-off relationship.

This trade-off between the read margin and the read current reduces the operating voltage of the SRAM because the overdrive voltage approaches the magnitude of threshold-voltage variation of the selection transistor by reducing power supply voltage when some selection transistors are on while others are not. In other words, the read current may vary by orders of magnitude. As a result, cells which cannot be read in a practical time period but have a larger noise margin and cells which can be read at high speed but have a smaller noise margin are concurrently present in the same array.

Patent Documents 1 to 3 disclose SRAM devices which use a four-terminal double gate field effect transistor, of which two gates of the double gate field effect transistor are separated from each other, as the selection transistor. These SRAM devices can adjust a threshold voltage of the selection transistor in order to increase the respective noise margins either in the read operation or in the write operation. However, there is still the trade-off relationship between the noise margin and the read speed in the read operation.

Accordingly, determining the operational sped based on a cell with the highest read speed results in cells which cannot be read, while determining the read speed based on the cell with the highest stability results in a significant decrease in the speed.

Patent Document 1: JP 2007-20110
Patent Document 2: U.S. Pat. No. 7,511,989
Patent Document 3: WO 2008/114716

DISCLOSURE OF INVENTION

Problems to be Solved by the Invention

Accordingly, an object of the present invention is to address the above-mentioned problems, and another object is to provide an SRAM device which can set a threshold voltage of a selection transistor appropriate for all the cells of a SRAM array.

Means for Solving the Problems

The above-mentioned problems are solved by a SRAM device using a field effect transistor as a selection transistor, the field effect transistor comprising a gate to drive the transistor and a terminal to control a threshold voltage, which are electrically separated from each other, wherein the SRAM device comprises a first circuit which, in a reading operation, gradually increases a voltage supplied to the terminal, from a voltage at the start of the reading operation, to control the threshold voltage of the selection transistor.

The SRAM device may further include a second circuit which detects the completion of the reading, and a third circuit which, responsive to detection of completion of the reading operation, returns the voltage supplied to the terminal to the voltage at the start of the reading.

The second circuit which detects the completion of the reading includes both a circuit which amplifies a potential difference of a bit line pair and a circuit which flips an output signal when the resultant, amplified potential difference exceeds a certain threshold.

The circuit which flips the output signal when the resultant, amplified potential difference exceeds a certain threshold is an exclusive OR gate.

The circuit which amplifies the potential difference of the bit line pair may be a differential amplifier provided with loads, differential-pair transistors, an output reset switch, and a current source to fix an output common-mode level.

The certain threshold for the amplified potential difference is a logic threshold of a logic gate which provides an exclusive OR.

The terminal which controls the threshold voltage of the selection transistor is connected to wires arranged in a direction parallel to the bit line.

A signal potential of a word line is adjusted so as to reduce leakage current which flows through the bit line and cells belonging to non-selected rows.

The SRAM device may further include, on each row, a circuit which determines the signal potential suitable to an operation of a corresponding row according to a row selection signal of a row decoder, and outputs the signal potential to the word line.

The selection transistor may be a four-terminal double gate field effect transistor of which two gates on both sides of a standing semiconductor thin plate are insulated from each other.

Effect of the Invention

An SRAM device according to the present invention sets an optimal threshold voltage for a selection transistor of each cell during a read operation of a cell, without affecting other cells. Therefore, it can always maintain a read margin and read speed at optimal values, compensate for a random variation in the devices, and perform the read operation at a high speed and stability.

BEST MODE FOR CARRYING OUT THE INVENTION

Figure 1:
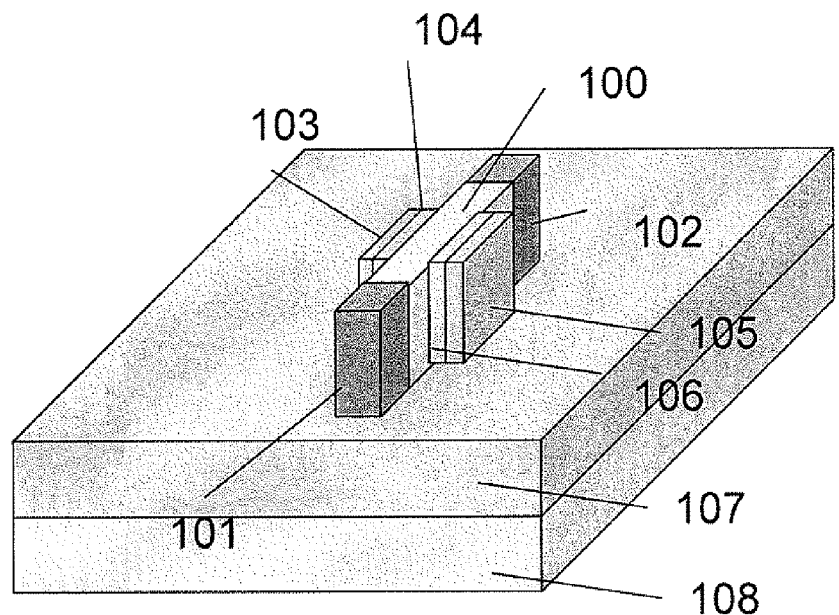
FIG. 1 is a figure schematically illustrating a configuration of a four-terminal double gate field effect transistor.

FIG. 1 is a figure schematically illustrating the structure of a four-terminal double gate field effect transistor, of which two gates are insulated from each other, which constitutes a SRAM cell. Reference numeral 100 in FIG. 1 represents a Silicon On Insulator (SOI) layer of an SOI wafer which is formed into a standing thin plate. Reference numerals 101 and 102 represent a source electrode and a drain electrode which are highly doped with an impurity. Reference numerals 103 and 104 represent a first gate electrode and a gate insulation film. Reference numerals 105 and 106 represent a second gate electrode and a gate oxide film. Reference numeral 107 is a buried oxide (BOX) layer. Reference numeral 108 represents a semiconductor substrate layer. The first gate electrode 103 and the second gate electrode 104 are electrically separated and placed on opposite surfaces of a fine semiconductor thin plate which is standing.

Further, it is known that a device formed from a bulk wafer, without an SOI structure, provides the same function as that of the device shown in FIG. 1, where 104 and 108 are formed from the identical silicon layer and 107 is deposited. Therefore, the present invention can be similarly applied on a device which is created from such a bulk wafer.

When the first gate electrode 103 of the four-terminal double gate field effect transistor is used as a signal input gate and the second gate electrode 105 is used as a bias voltage input gate, a threshold voltage on the signal input gate of the transistor can be changed by an input voltage of the bias voltage input gate. As a result, an effect similar to the body bias effect in a bulk planar MOS can be attained. In this case, unlike the case of the bulk planar MOS, when an integrated circuit is configured with four-terminal double gate field effect transistors, the threshold voltages of the respective devices can be controlled independently.

Figure 2A:
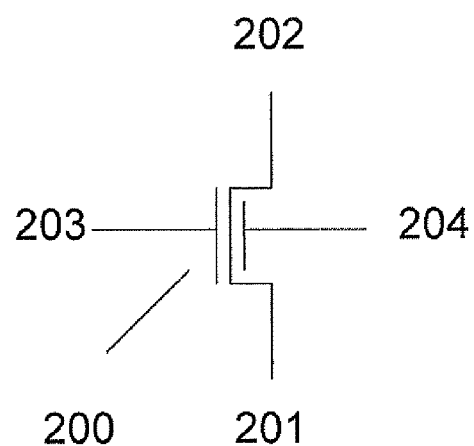
FIGS. 2A and 2B are schematic illustrations of four-terminal double gate field effect transistors.
Figure 2B:
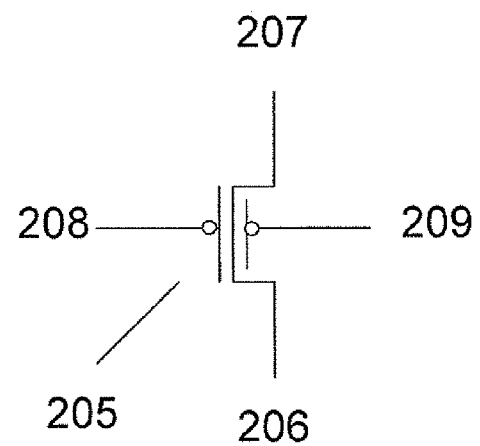

FIGS. 2A and 2B show four-terminal double gate field effect transistors. A device 200 represents an n-channel field effect transistor. A device 205 represents a p-channel field effect transistor. The terminals of the n-channel field effect transistor 200 consist of a source terminal 201, a drain terminal 202, a first gate terminal 203, and a second gate terminal 204. The terminals of the p-channel field effect transistor 205 consist of a source terminal 206, a drain terminal 207, a first gate terminal 208, and a second gate terminal 209.

First Embodiment

As described above, a four-terminal double gate field effect transistor is used as the selection transistor. Each transistor which flip-flops is a conventional double gate field effect transistor in which two gates are connected. As a result, a 6-transistor SRAM cell is configured as shown in FIG. 3.

The wires Vt-Ctrl from the threshold voltage control gate of the four-terminal double gate field effect transistor are respectively connected to wires parallel to bit lines BL to BL~. Here, each MN31 and MN32 is different from the four-terminal double gate field effect transistor, and is a conventional n-channel double gate field effect transistor in which two gates are connected to each other. MP31 and MP32 are conventional p-channel double gate field effect transistors. In addition, selection transistors MN33 and MN34 are four-terminal double gate n-channel field effect transistors.

Figure 3:
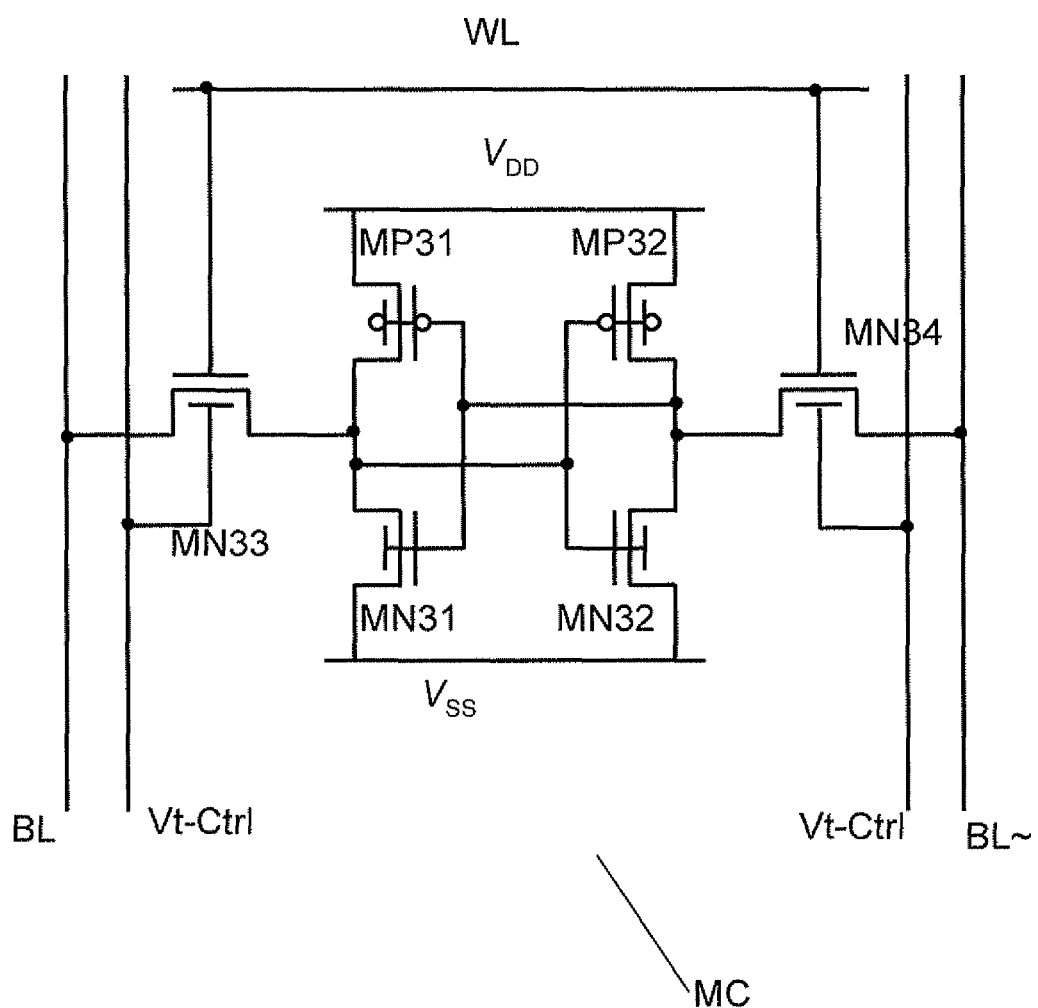
FIG. 3 is a circuit diagram of a SRAM cell which comprises the four-terminal double gate field effect transistor as a selection transistor.
Figure 4:
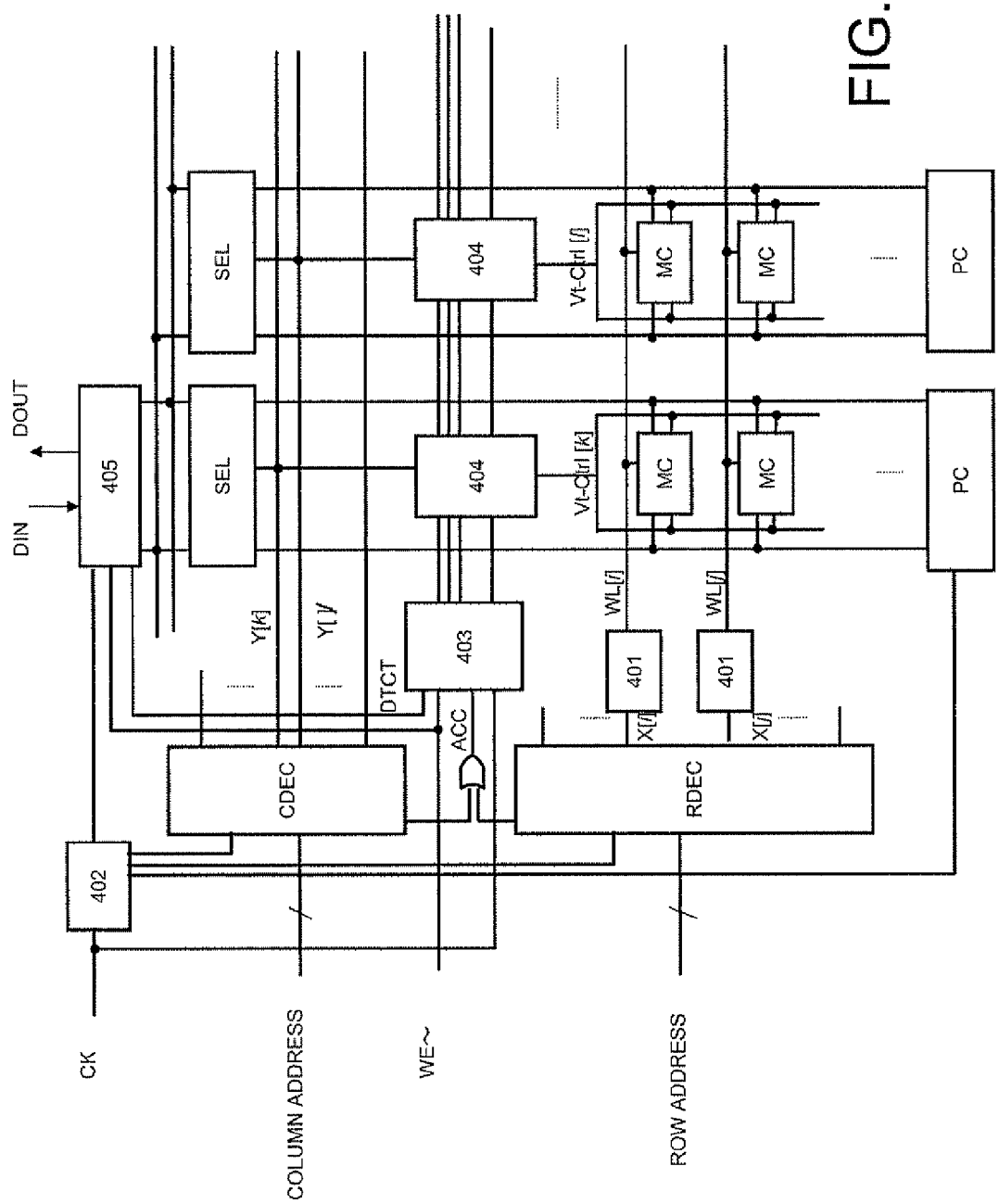
FIG. 4 is a circuit diagram of a SRAM device, in which the SRAM cell shown in FIG. 3 is applied, according to a first embodiment.
Figure 5:
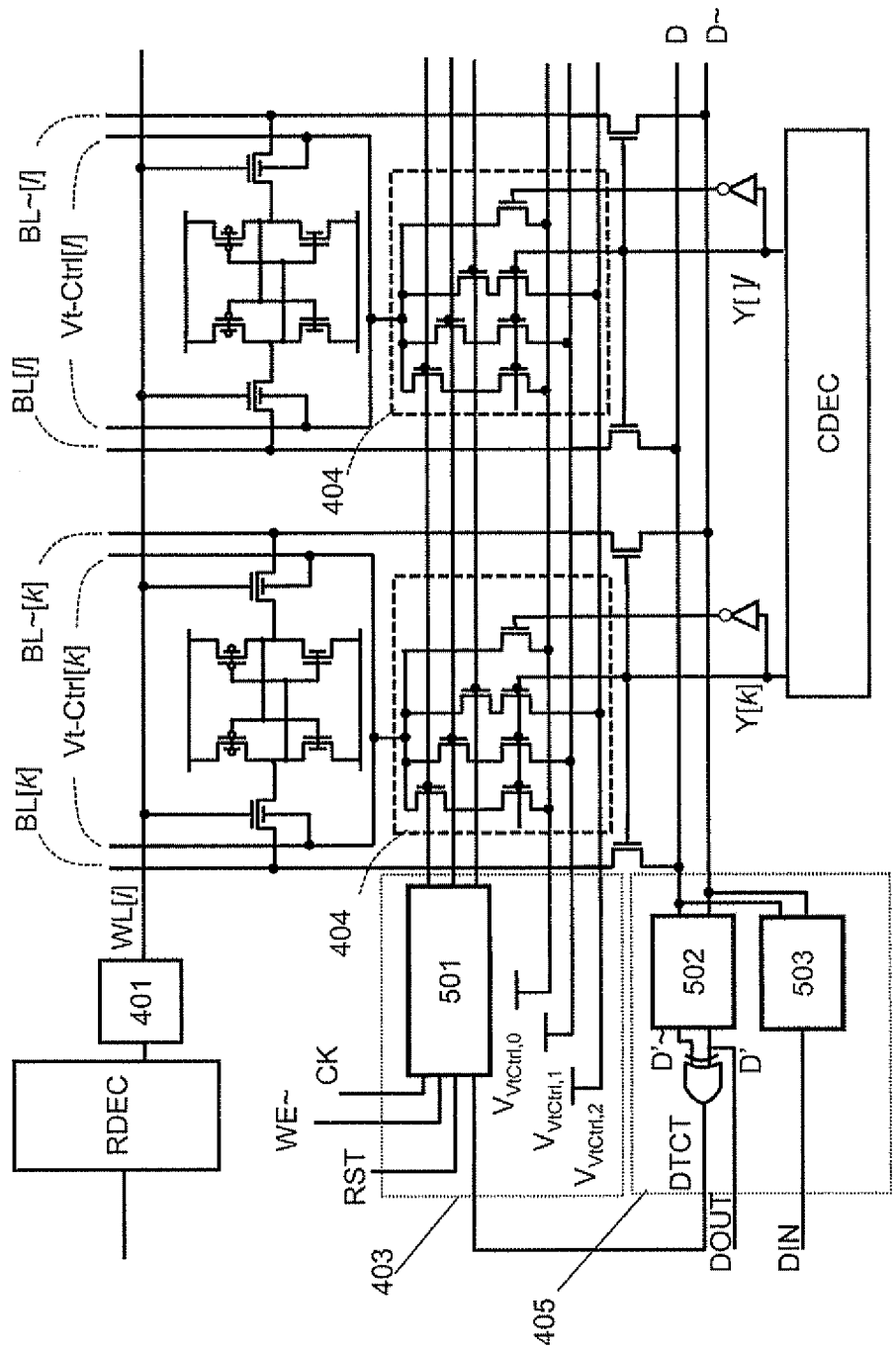
FIG. 5 is a circuit diagram specifically illustrating a part of the SRAM device shown in FIG. 4, corresponding to the first embodiment.
Figure 6:
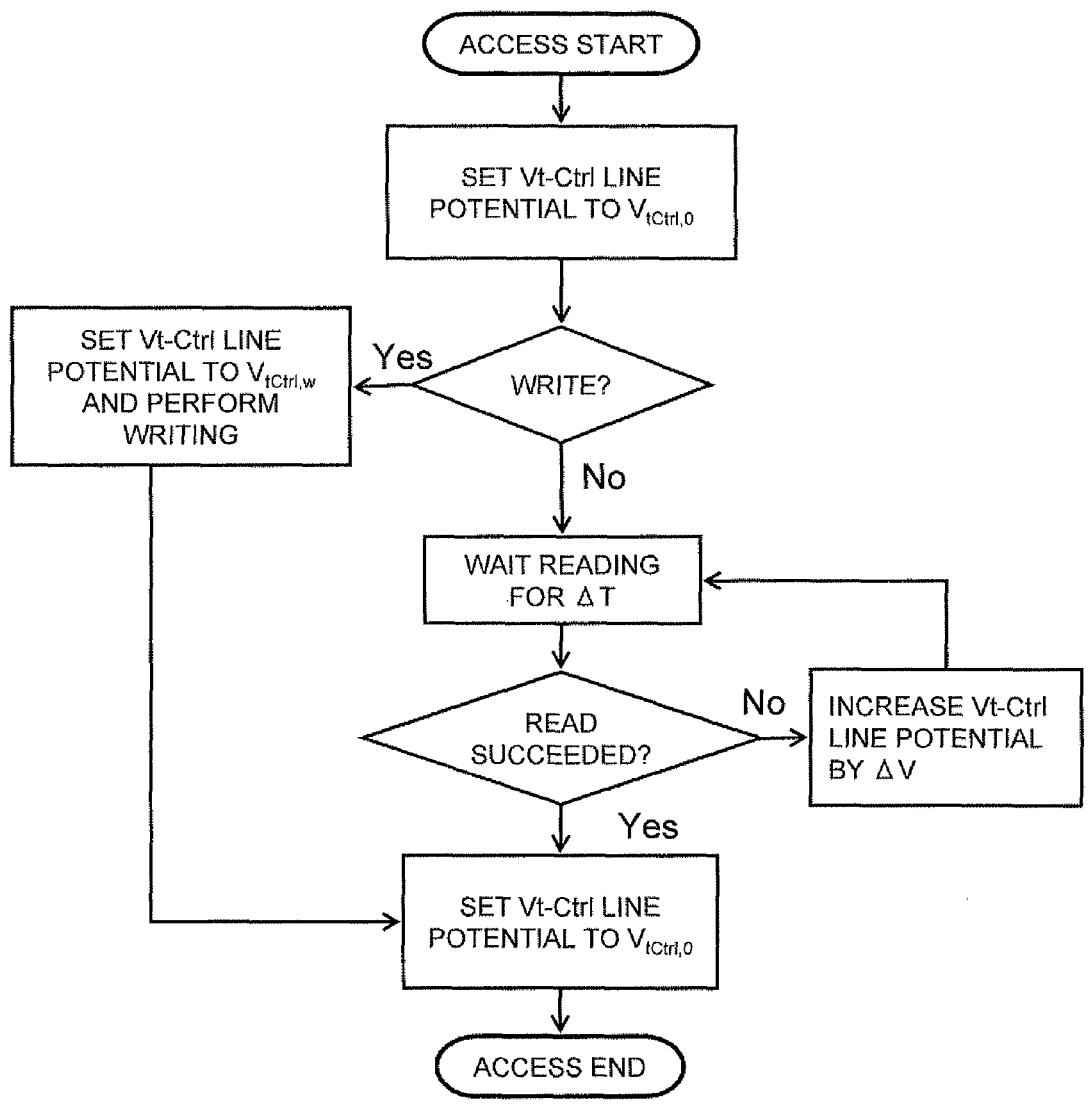
FIG. 6 is a figure illustrating a voltage control algorithm of a Vt-Ctrl line for operating the SRAM device shown in FIGS. 4 and 5.

The SRAM cell shown in FIG. 3 is applied to the SRAM device shown in FIGS. 4 and 5, a diagram showing a part of FIG. 4 in detail, and an algorithm shown in FIG. 6 is executed in the SRAM device. With the configuration illustrated in FIGS. 3-6, the present invention achieves optimization of the read time and read noise margin for each cell. Here, reference numeral 401 represents a circuit for driving a word line WL. RDEC and CDEC respectively represent a circuit block comprising row decoders, and latches or registers for storing addresses to be input to the decoders, and a circuit block comprising column decoders, and latches or registers.

In addition, PC represents a circuit for pre-charging the bit lines BL and BL~, and SEL represents a selector for selecting a column specified by a column address. Reference numeral 402 schematically represents a circuit block for adjusting timing of each circuit by dividing or multiplying a clock CK and providing it with an appropriate delay, for example.

Circuit element 403 includes reference voltage sources $V_{VtCtrl,0}$, $V_{VtCtrl,1}$, $V_{VtCtrl,2}$ and a control logic circuit 501, and outputs a potential and control signal for the Vt-Ctrl line of each column. In addition, circuit element 405 includes a sense amplifier 502 and a write circuit 503, wherein 503 outputs data to the wires D and D~ in accordance with the logic of write enable WE or disconnects 503 from D and D~. Circuit element 404 actually supplies voltage to the Vt-Ctrl line in accordance with a signal from 403 and a column selection signal Y.

The operation of the SRAM device shown in FIGS. 3 to 5 will be described for a read operation on a cell with the address (i, k), followed by a write operation on a cell (j, l).

(1) A pre-charge circuit PC inputs a signal PCS to the bit lines BL to BL~ on the basis of the clock signal CK, and performs pre-charging.

(2) Row addresses and column addresses are respectively decoded by RDEC and CDEC. For example, when the address (i, k) is specified from M×N addresses in total, WL[i] and a column selection signal Y[k] are raised after the pre-charging operation.

(3) Here, if a write enable signal WE is 0, i.e., a WE~ signal indicates the read operation of 1, the Vt-Ctrl control logic 501 initiates its operation on the basis of the algorithm shown in FIG. 6, 501 continues to change a Vt-Ctrl [k] signal from $V_{VtCtrl,0}$ to $V_{VtCtrl,1}$, $V_{VtCtrl,2}$, $V_{VtCtrl,3}$, and so on, until it detects a signal DTCT which is an exclusive OR of an output pair D' and D'~ of the sense amplifier 502. Note that the voltages that come after $V_{VtCtrl,2}$ are omitted in FIG. 5.

(4) If DTCT=1 is detected, Vt-Ctrl[k] is returned to $V_{VtCtrl,0}$.

(5) On the other hand, if the write operation is specified by WE=1 for (j, l), a writing reference voltage $V_{VtCtrl,w}$ is selected for Vt-Ctrl [l] (note that it is omitted in FIG. 5), and fast and stable writing is realized.

Figure 7:
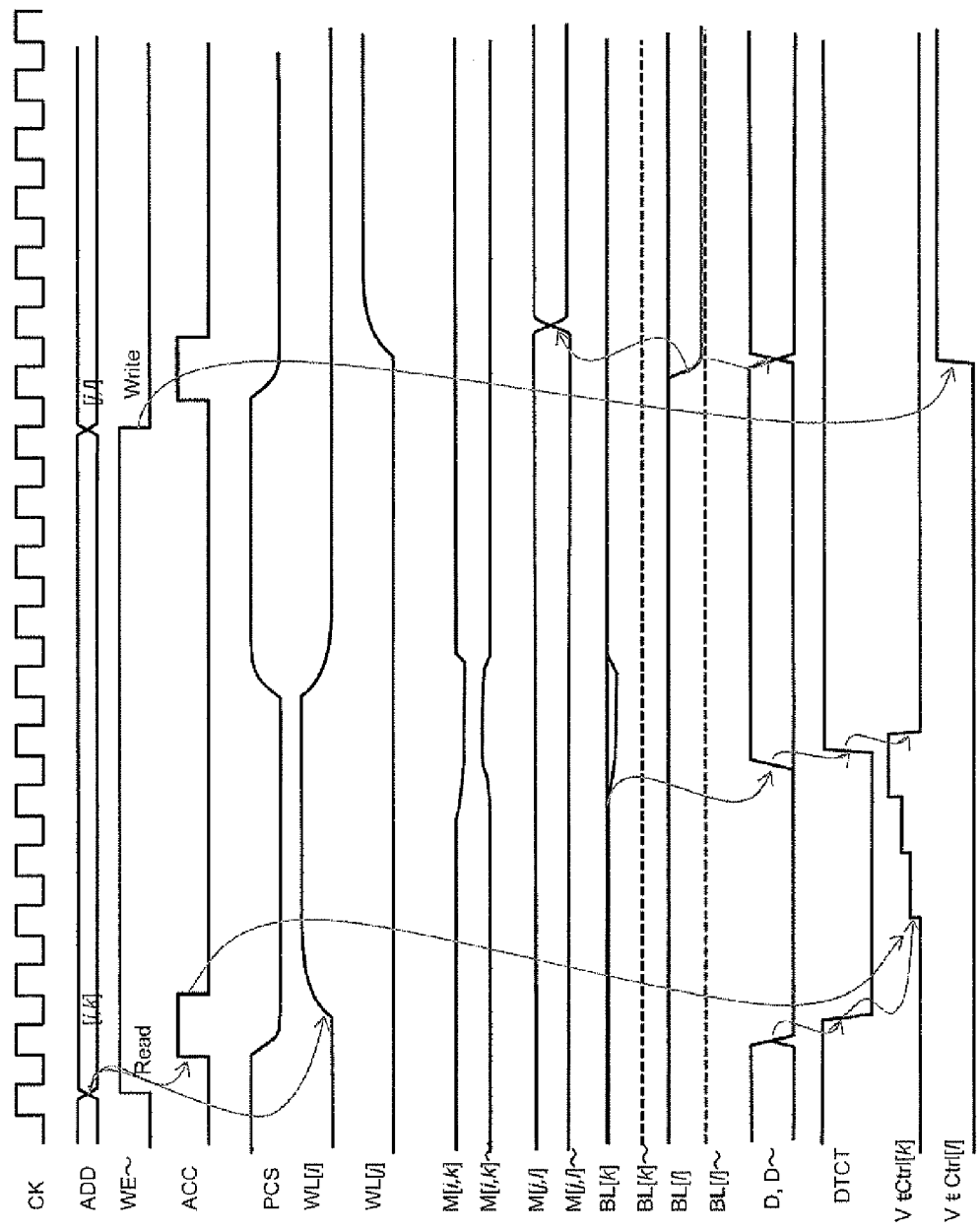
FIG. 7 is an example of a timing chart of operation of the SRAM device shown in FIGS. 4 and 5.

The timing chart of FIG. 7 shows that Vt-Ctrl for the reading is completed in four steps.

Moreover, the Vt-Ctrl control logic 501 operates as follows. The reading access is performed first and, among the control logic input values, ACC turns to 1 and WE turns to 0, then 501 continues its state transition until a DTCT bit is raised. When the DTCT bit is raised, a sequential logic returns to its initial state. With a logic signal to be output along with the state transition, 404 selects Vt-CTRL.

Second Embodiment

Figure 8:
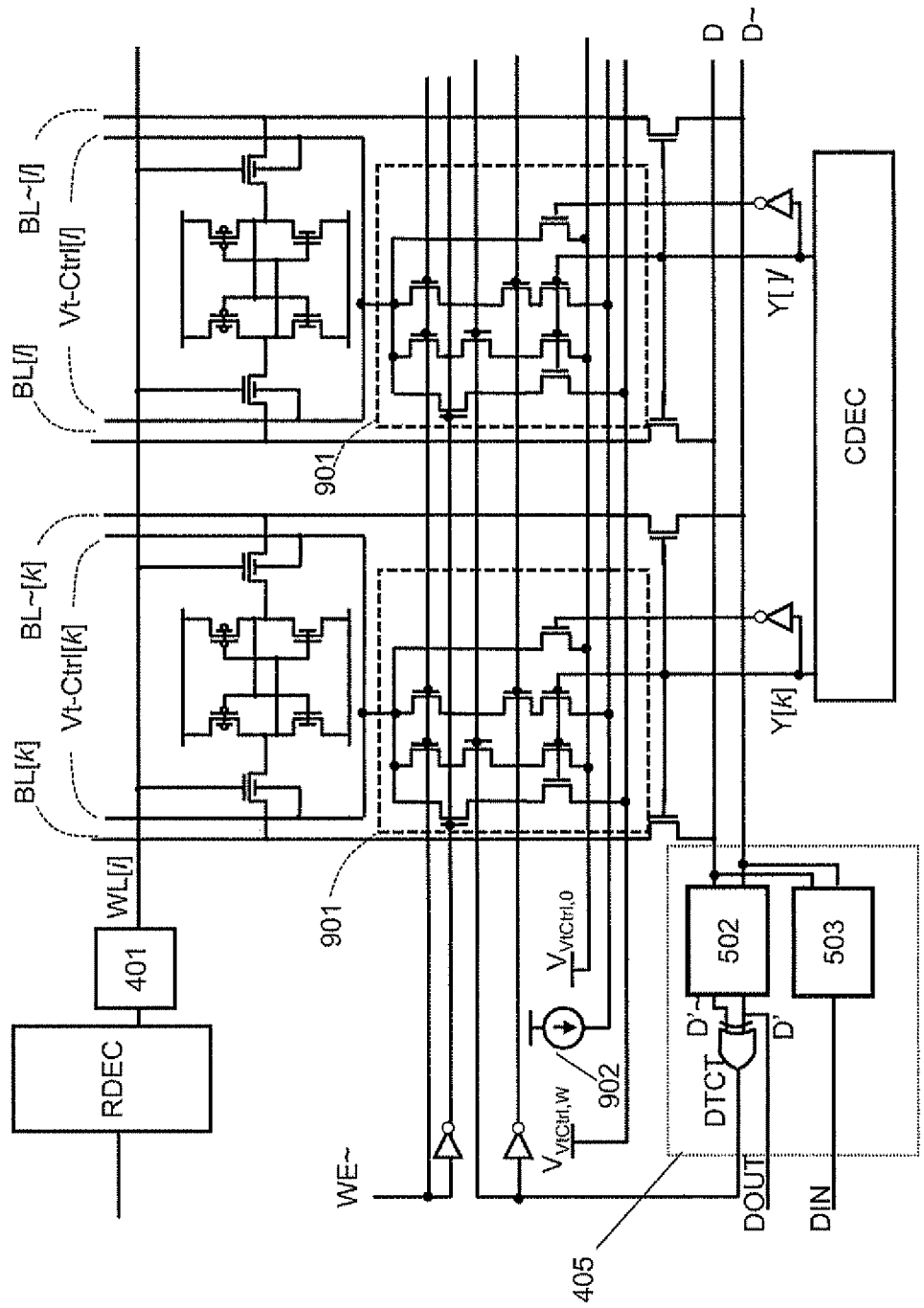
FIG. 8 is a circuit diagram specifically illustrating a part of the SRAM device shown in FIG. 4, corresponding to a second embodiment.

FIG. 8 shows a method in which an inverter and a reference current source 902 are substituted for the logic circuit 501 shown in FIG. 5, and a selector 901 is substituted for circuit element 404, to increase the voltage input into Vt-Ctrl continuously, rather than changing stepwise. According to this embodiment, the circuits can be simplified significantly because they omit the clock CK and logic circuits. That is, when the column selection signal Y is raised, the Vt-Ctrl line which has been shorted to $V_{VtCtrl,0}$ is connected to the current source 902, so that Vt-Ctrl is increased continuously. When DTCT is raised at a certain point, Vt-Ctrl is returned to $V_{VtCtrl,0}$ at that point. In addition, if WE=1, $V_{VtCtrl,w}$ is selected.

Third Embodiment

Figure 9:
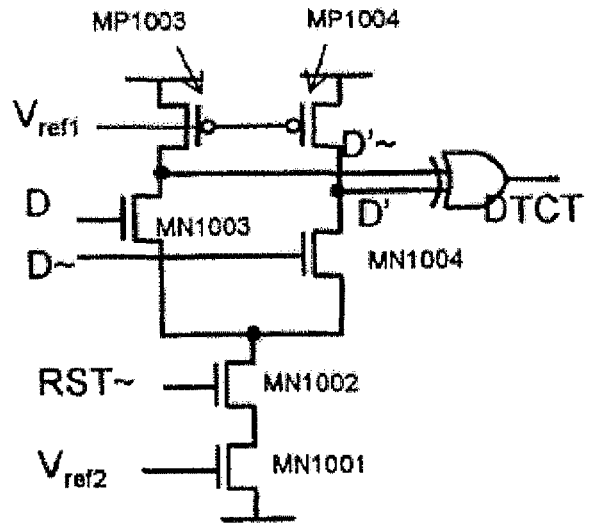
FIG. 9 is a figure illustrating a configuration of a sense amplifier shown in a third embodiment.

FIG. 9 shows details of the sense amplifier 502. The sense amplifier 502 includes a differential amplifier consisting of loads, differential pair transistors, an output reset switch, and a current source for fixing an output common-mode potential. In this embodiment, a differential-pair sense amplifier, as shown in FIG. 9, is added with a tail current source driven by $V_{ref2}$. This sense amplifier 502 keeps both of the output signal pair fixed to the signal level, around a certain common-mode output level, by operation of the tail current source until a read-out result is determined, and the noise margin for a common-mode noise or an offset voltage of the sense amplifier itself is ensured.

Hereafter, the operations of the sense amplifier 502 will be described sequentially.

When RST=1, i.e., RST~=0, MN1002 is turned OFF and the outputs D' and D'~ of the sense amplifier 502 become VDD, so that the output is reset. When RST is turned to 0, i.e., RST~=1, MN1002 is turned ON and a sense operation is initiated. First, immediately after the start of the read operation, the pair of BL and BL~ substantially holds the pre-charged voltage. As such, D and D~ are not different from each other, so that the outputs D' and D'~ maintain their level around the common-mode output level.

Figure 10:
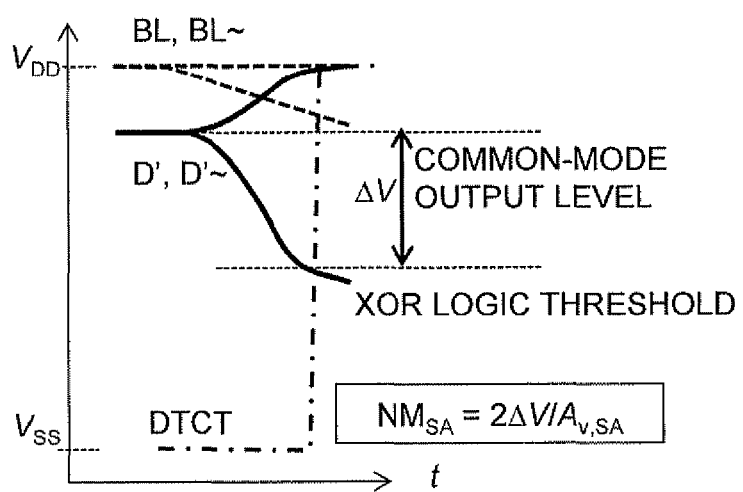
FIG. 10 is a figure schematically illustrating a transient response of the sense amplifier shown in FIG. 9.

Although BL and BL~ begin to generate a potential difference immediately after the start of the reading, when it is still a small difference, the inherent potential difference between BL and BL~ may be flipped by a current leakage from a non-accessed cell or the offset voltage of the sense amplifier 502 itself. However, as shown in the conceptual diagram of a transient response of the sense amplifier 502 in FIG. 10, the risk of an erroneous reading can be appropriately avoided by designing the device so that the common-mode output level is appropriately higher than a logic threshold of an exclusive OR (XOR) gate. Here, when a differential gain is represented as $A_{vSA}$ and a difference between the common-mode output level and the logic threshold of the XOR gate is represented as $\Delta V$, a noise margin $NM_{SA}$ of the sense amplifier is given by $2\Delta V/A_{vSA}$.

As the potential difference between BL and BL~ becomes sufficiently large, the potential difference between the outputs D' and D'~ also increases, so that the output DTCT of the exclusive OR, which indicates that data is detected, is flipped from 0 to 1 and the completion of the reading is transmitted to 403.

Fourth Embodiment

Figure 11:
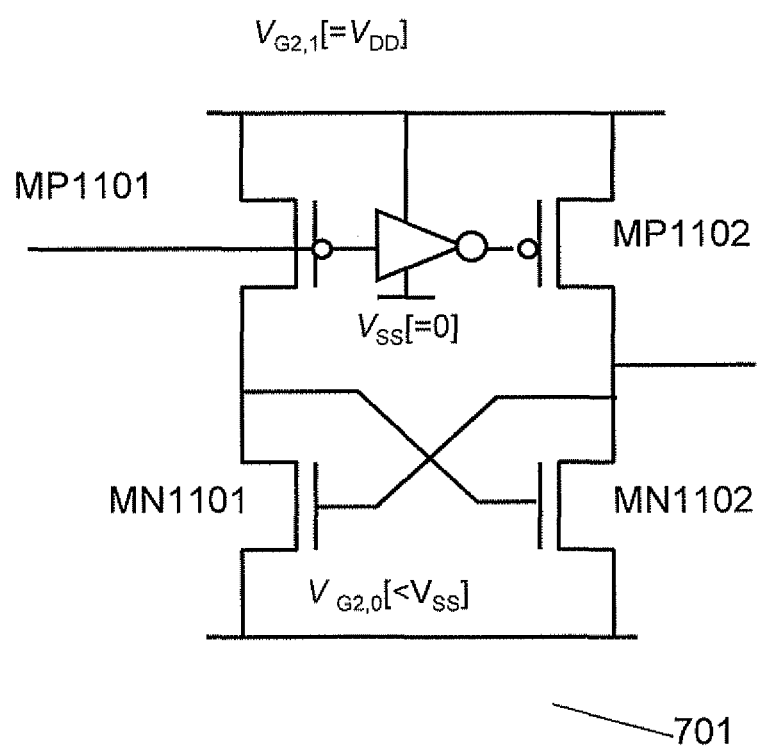
FIG. 11 is a circuit diagram of a WL driver 401, or a level shifter included therein, of a fourth embodiment.

The present invention can also utilize a WL driver 401 having a configuration similar to a conventional SRAM. However, when the potential of the Vt-Ctrl line connected to the second gates of the selection transistors MN33 and MN34 of the cell becomes high, the current leakage may increase at the selection transistor of a non-selected cell present in an accessed column and the reading may be disturbed. To avoid the foregoing problem, in this fourth embodiment element 401 is a level shifter 701 as shown in FIG. 11, or element 701 and a following driver which has a logic signal lower than that of a low voltage source VSS of the cell. By using such a configuration to drive WL, current leakage can be reduced.

REFERENCE SYMBOLS

100: SILICON ON INSULATOR (SOI) LAYER OF SOI WAFER WHICH IS FORMED INTO STANDING THIN PLATE
200: n-CHANNEL FIELD EFFECT TRANSISTOR
205: p-CHANNEL FIELD EFFECT TRANSISTOR
300: SRAM CELL
401: WL DRIVER
402: CIRCUIT BLOCK FOR TIMING ADJUSTMENT
403: CIRCUIT BLOCK TO GENERATE AND SUPPLY Vt-Ctrl CONTROL SIGNAL AND VOLTAGE TO BE SUPPLIED TO Vt-Ctrl LINE
404: CIRCUIT BLOCK TO SELECTIVELY SUPPLY Vt-Ctrl SIGNAL TO COLUMN ON THE BASIS OF COLUMN SELECTION SIGNAL AND CONTROL SIGNAL FROM 403
405: CIRCUIT BLOCK INCLUDING SENSE AMPLIFIER AND WRITE CIRCUIT
501: Vt-Ctrl VOLTAGE CONTROL CIRCUIT BLOCK
502: SENSE AMPLIFIER
503: WRITE CIRCUIT
701: LEVEL SHIFTER TO SUPPLY WL SIGNAL AND ITS POTENTIAL TO SRAM CELL INSTEAD OF 401
901: Vt-Ctrl VOLTAGE CHARGE/DISCHARGE CIRCUIT
902: CONSTANT CURRENT SOURCE
WL: WORD LINE AND SIGNAL THEREOF
BL, BL~: BIT LINE MC: MEMORY CELL
$V_{DD}$: HIGH VOLTAGE SOURCE OF CELL
$V_{SS}$: LOW VOLTAGE SOURCE OF CELL
Vt-Ctrl: BIAS VOLTAGE SUPPLY LINE FOR SELECTION TRANSISTOR THRESHOLD VOLTAGE CONTROL OF CELL AND SIGNAL THEREOF
CK: CLOCK SIGNAL
X: ROW SELECTION SIGNAL
Y: COLUMN SELECTION SIGNAL
ACC: ACCESS SIGNAL
DTCT: DATA DETECTION SIGNAL
PC: PRE-CHARGE CIRCUIT
RDEC: ROW DECODER
CDEC: COLUMN DECODER
SEL: SELECTOR CIRCUIT
DIN: WRITE DATA
DOUT: READ DATA
D, D~: SELECTOR OUTPUT SIGNAL AND SENSE AMPLIFIER INPUT
D', D'~: SENSE AMPLIFIER OUTPUT
WE, WE~: WRITE CONTROL SIGNAL AND NEGATIVE LOGIC SIGNAL THEREOF
RST, RST~: RESET SIGNAL AND NEGATIVE LOGIC SIGNAL THEREOF $V_{tCtrl,0}$, $V_{tCtrl,1}$, $V_{tCtrl,2}$: VOLTAGE SOURCE CONNECTING TO Vt-Ctrl LINE AND OUTPUT VOLTAGE THEREOF
PCS: PRE-CHARGE CIRCUIT OUTPUT SIGNAL
M,M~: MEMORY NODE CONNECTING TO BIT LINE BL, BL~ AND SIGNAL THEREOF
$V_{G2,0}$, $V_{G2,1}$: LOW LEVEL POTENTIAL AND HIGH LEVEL POTENTIAL OF WL VOLTAGE SIGNAL
$V_{ref1}$, $V_{ref2}$: REFERENCE VOLTAGE
MN31, MN32, MN33, MN34, MN1001, MN1002, MN1003, MN1004, MN1101, MN1102: n-CHANNEL DEVICE
MP31, MP32, MP33, MP34, MP1003, MP1004, MP1101, MP1102: p-CHANNEL DEVICE

The invention claimed is:

1. An SRAM device comprising a field effect transistor as a selection transistor, the field effect transistor comprising a gate to drive the transistor and a terminal to control a threshold voltage, which are electrically separated from each other, wherein the SRAM device comprises a first circuit which gradually increases, on a reading operation, a voltage supplied to the terminal to control the threshold voltage of the selection transistor from a voltage at the start of the reading.

2. The SRAM device according to claim 1, further comprising a second circuit which detects the completion of the reading, and a third circuit which returns, on the reading operation, the voltage supplied to the terminal to control the threshold voltage of the selection transistor, that has been gradually increased, to the voltage at the start of the reading, when the second circuit which detects the completion of the reading detects the read completion.

3. The SRAM device according to claim 2, wherein the second circuit which detects the completion of the reading is configured by a fourth circuit which amplifies a potential difference of a bit line pair and a fifth circuit which flips an output signal when the result, amplified potential difference, exceeds a certain threshold.

4. The SRAM device according to claim 3, wherein the fifth circuit which flips the output signal when the result exceeds a certain threshold is configured by an exclusive OR gate.

5. The SRAM device according to claim 3, wherein the fourth circuit which amplifies the potential difference of the bit line pair is configured by a differential amplifier provided with loads, differential-pair transistors, an output reset switch, and a current source to fix an output common-mode level.

6. The SRAM device according to claim 3, wherein the certain threshold is designed to be a logic threshold of a logic gate which provides an exclusive OR.

7. The SRAM device according to claim 1, wherein the terminal to control the threshold voltage of the selection transistor is connected to wires arranged in the column direction parallel with a bit line.

8. The SRAM device according to claim 1, wherein a signal potential of a word line is adjusted so as to reduce leakage current which flows through the bit line and cells belonging to non-selected rows.

9. The SRAM device according to claim 1, further comprising, on each row, a second circuit which determines the signal potential suitable to an operation of a corresponding row according to a row selection signal of a row decoder, and outputs the signal potential to the word line.

10. The SRAM device according to claim 1, wherein the selection transistor is configured by a four-terminal double gate field effect transistor of which two gates on both sides of a standing semiconductor thin plate are insulated from each other.

* * * * *